United States Patent
Sachdev et al.

(10) Patent No.: US 6,525,009 B2
(45) Date of Patent: Feb. 25, 2003

(54) POLYCARBOXYLATES-BASED AQUEOUS COMPOSITIONS FOR CLEANING OF SCREENING APPARATUS

(75) Inventors: Krishna G. Sachdev, Hopewell Junction, NY (US); Glenn A. Pomerantz, Kerhonkson, NY (US); Daniel S. Mackin, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 09/731,621

(22) Filed: Dec. 7, 2000

(65) Prior Publication Data

US 2002/0072482 A1 Jun. 13, 2002

(51) Int. Cl.⁷ .............................. C11D 1/72; C11D 3/22
(52) U.S. Cl. .................. 510/175; 510/174; 510/177; 134/2; 134/3; 134/38; 134/42
(58) Field of Search .................. 510/175, 176, 510/177, 477, 434; 134/2, 3, 38, 42

(56) References Cited

U.S. PATENT DOCUMENTS

| | | | |
|---|---|---|---|
| 4,362,486 A | | 12/1982 | Davis et al. |
| 4,483,040 A | | 11/1984 | Magee et al. |
| 5,431,847 A | | 7/1995 | Winston et al. |
| 5,433,885 A | | 7/1995 | Winston et al. |
| 5,466,389 A | * | 11/1995 | Illardi et al. |
| 5,498,293 A | | 3/1996 | Ilardi et al. |
| 5,523,023 A | | 6/1996 | Kleinstuck et al. |
| 5,561,105 A | * | 10/1996 | Honda |
| 5,574,113 A | | 11/1996 | Kroner et al. |
| 5,593,504 A | | 1/1997 | Cala et al. |
| 5,656,646 A | | 8/1997 | Perner et al. |
| 6,277,799 B1 | * | 8/2002 | Sachdev et al. |

* cited by examiner

Primary Examiner—Gregory E. Webb
(74) Attorney, Agent, or Firm—Ira D. Blecker

(57) ABSTRACT

An aqueous alkaline cleaning composition for efficient removal of Mo, Cu, W, or Cu/Ni-based conductive paste residue from screening masks, associated screening equipment and the like by using alkali metal salt and/or tetramethyl ammonium salt of polyacrylic acid, acrylic acid-methacrylic acid co-polymer, polyaspartic acid, polylactic acid, poly(acrylic acid-co-maleic anhydride), poly(maleic acid), with excess alkali for pH adjustment in the range of about 11.5–13.5, and a surfactant which may be a medium foam, low foam or no-foam surfactant, and is preferably an amphoteric and/or non-ionic and/or ionic surfactant.

32 Claims, No Drawings

POLYCARBOXYLATES-BASED AQUEOUS COMPOSITIONS FOR CLEANING OF SCREENING APPARATUS

FIELD OF THE INVENTION

This invention relates to low foam aqueous cleaning compositions for cleaning metal-polymer composite paste residue from the surface of screening masks, associated screening equipment and the like in the manufacture of ceramic substrates for semiconductor packaging applications. More particularly, the present invention is concerned with aqueous alkaline cleaning solutions comprising carboxylate or aminocarboxylate polymer salts and low foam surface active agents as a solvent replacement in high speed cleaning of paste screening masks, associated screening equipment and the like in the fabrication of multi-layer ceramic substrates.

BACKGROUND OF THE INVENTION

Standard processing for ceramic substrate production, particularly for multilayer ceramic substrates, involves a series of operations starting with preparation of ceramic slurry comprising ceramic filler, organic binder, solvent vehicle and plasticizer; green sheet casting; blanking; via punching; circuit personalization or screening of conductive paste through a screen mask, followed by singulation/sizing; inspect/collate/register operations; stack and lamination; and finally binder burn-off and sintering.

In the circuit personalization process step in the formation of ceramic substrates, conductive metal features for wiring and via metallurgy on the substrate are defined by screening metal-polymer composite paste through a contact mask, such as a metal mask having a closely spaced fine dimension pattern etched in molybdenum (Mo) foil or electroform mask such as copper-nickel or copper-nickel-copper masks. Paste screening through such masks leaves paste residue on the mask surface as well as on the side walls of the mask features. This residue must be removed after each screening pass or multiple screening passes depending on the paste composition and mask type in order to assure consistent quality defect-free screened patterns. Associated screening equipment can also be contaminated with this paste residue and must be cleaned periodically.

Conductive pastes used in screening processes for the wiring and via metallurgy basically comprise metal particles dispersed in an organic binder and solvent vehicle along with wetting agents, dispersants/surfactants, plasticizers, and other additives such as rheology modifiers, thickening agents, antioxidants, and coloring agents.

The conductive pastes commonly used in multi-layer ceramic substrate production are dispersions of a metal powder as the predominant component, typically molybdenum (Mo), copper (Cu), tungsten (W), copper in combination with nickel (Ni), in a polymer binder such as ethyl cellulose, polyalkyl methacrylate (for example, polymethyl methacrylate or polyethyl methacrylate), and a high boiling solvent such as 2,4,4-trimethyl-1,3-pentane diol monoisobutyrate (Texanol), butylcarbitol acetate (BCA), a suitable surfactant or dispersant and a thickening agent or rheology modifier. Selection of a conductive paste for a particular layer pattern in multi-layer ceramic substrate is dictated by the requirement for the desired circuit pattern and compatibility of the paste with green sheet material.

The above fabrication processes and equipment used to produce ceramic substrates with paste-screened metallization are well known in the art.

Because of the variety and complex chemical make-up of the polymer/metal dispersions which form the pastes, it is required that the mask cleaning medium and process selected be such that it provides complete and efficient cleaning of paste residue on screening masks, associated screening equipment and the like regardless of the paste characteristics in terms of wettability, solubility, polarity, etc.

An automated in-line paste-screening and mask cleaning process using perchloroethylene as a cleaning agent for metal masks used in multilayer ceramic technology is described in Davis et al. U.S. Pat. No. 4,362,486 and Magee et al. U.S. Pat. No. 4,483,040, the disclosures of which are incorporated by reference herein. This process is designed for real time operation to provide compatibility with high throughput screening in a production environment.

Chlorinated solvents such as 1,1,1-trichloroethane, perchloroethylene, fluorochlorocarbons, and related halogenated hydrocarbons are non-flammable and highly effective solvents which have been used in the past for a multitude of industrial applications. It would be desirable to replace these chlorinated solvents.

The challenge is to replace an effective solvent-based mask cleaning composition with an aqueous cleaning process that is equally as effective as the chlorinated solvent-based cleaning process for paste residue from screening masks and associated screening parts.

Therefore, this invention is concerned with the aqueous cleaning of screening masks, associated screening equipment and the like that are used in the process of screening metal-polymer conductive paste onto green sheets in the manufacture of ceramic substrates.

Winston et al. U.S. Pat. Nos. 5,431,847 and 5,433,885, the disclosure of which are incorporated by reference herein, disclose an aqueous cleaning composition comprising an alkaline salt and concentrates of anionic polymers comprising polyacrylic acid in conjunction with a hydrotrope to stabilize alkali metal silicates to prevent silicate precipitation when used in the removal of Rosin fluxes from electronic circuit assemblies.

Ilardi et al. U.S. Pat. No. 5,498,293, the disclosure of which is incorporated by reference herein, discloses aqueous cleaning compositions for cleaning silicon wafers to remove metal contamination from the wafer surface without increasing surface micro-roughness of silicon wafers. The cleaning compositions are comprised of a metal ion-free base, an amphoteric surfactant, a metal complexing agent, and propylene glycol ether as an organic solvent.

Kleinstuck et al. U.S. Pat. No. 5,523,023, the disclosure of which is incorporated by reference herein, discloses alkaline cleaning compositions and process for industrial water treatment according to which polyaspartic acid-based compositions carrying phosphonic acid are used for inhibition of incrustation or scale formation due to $Ca^{++}$ and $CO_3{-}2$ ions which lead to limescale deposits.

Kroner et al. U.S. Pat. No. 5,574,113, the disclosure of which is incorporated by reference herein, discloses the use of co-polymers derived from aspartic acid polymers used in the form of free acids or neutralized with ammonia, amines, or alkali metal hydroxide, as additives to detergents or cleaners as scale inhibitors or as dispersants.

Cala et al. U.S. Pat. No. 5,593,504, the disclosure of which is incorporated by reference herein, discloses a method of cleaning solder paste from metal stencils and screens with an aqueous cleaner based on alkali metal carbonate, a surfactant, alkali metal silicate, and a stabilizer for silicate to prevent gel formation, as a safer replacement of alcohol solvents.

Perner et al. U.S. Pat. No. 5,656,646, the disclosure of which is incorporated by reference herein, discloses the synthesis and use of polyamino carboxylic acids and/or polymers of mono- or dicarboxylic acids as additives for phosphate-free or low phosphate textile detergents or dispersants or coating inhibitors in cleaners.

Notwithstanding the efforts of those skilled in the art, there still remains a need for an effective, aqueous cleaning composition for removing screening paste residue from screening masks, associated screening equipment and the like while maintaining the cycle time requirement in automated mask cleaning operations without adverse impact on product throughput and product reliability.

Therefore, it is a purpose of the present invention to provide an alternate method for cleaning screening masks, is associated screening equipment and the like used in the production of ceramic substrates without an adverse impact on the mask integrity, cleaning quality, process reproducibility and cycle time in a manufacturing environment.

It is another purpose of this invention to provide an aqueous cleaning method for screening masks, associated screening equipment and the like where the dissolved metals and organics in the waste water are readily removed by standard treatment methods while the active ingredients in the cleaning solution are mostly biodegradable and thus the waste water can be safely discharged.

These and other purposes of the present invention will become more apparent after referring to the following description of the invention.

BRIEF SUMMARY OF THE INVENTION

The purposes of the invention have been achieved by providing, according to a first aspect of the invention, an aqueous alkaline cleaning composition for removing paste residue from screening masks, associated screening equipment and the like in the fabrication of ceramic substrates comprising a water soluble polycarboxylate salt in excess alkali and a surface tension lowering additive.

According to a second aspect of the invention, there is provided a method of cleaning paste residue from screening masks, associated screening equipment and the like comprising the step of contacting the screening mask or screening equipment having a paste residue with an aqueous alkaline cleaning composition comprising a water soluble polycarboxylate salt in excess alkali to obtain a pH of the solution in the range of about 11.5 to about 13.5, and a surface tension lowering additive.

DETAILED DESCRIPTION OF THE INVENTION

The aqueous cleaning compositions according to the present invention are comprised of an alkali metal salt and/or a quaternary ammonium salt of polymers of the type polyacrylic acid and/or polyaspartic acid such as polycarboxylate sodium, polycarboxylate potassium or polycarboxylate quaternary ammonium salts in aqueous alkali. Preferably, the cleaning solutions are alkaline solutions of pH in the range of about 11.5–13.5, and most preferably a pH of 11.9–12.8, and preferably further comprise a non-ionic and an amphoteric surfactant and/or an ionic surfactant which are preferably medium foam, low foam or no-foam type surfactants.

Preferred polycarboxylate salts are derived from low molecular weight (MW) about 1500–10,000 polyacrylic acid homopolymer (PAA) or its co-polymer with maleic anhydride (PAA-MA), and/or polyaspartic acid (PA), poly (maleic acid), poly(maleic acid-co-olefin), or poly (methacrylic acid), poly(acrylic acid-co--methacrylic acid), which is neutralized with alkali metal hydroxide, alkali metal carbonate, alkali metal bicarbonate, or neutralized with an organic base such as tetramethyl ammonium hydroxide, amines such as aliphatic amines, alkanolamines, or mixtures thereof. Polyacrylic acid homopolymers and co-polymers useful for the purpose of this invention are available from commercial sources, for example, under the trade names 'Acusol' acrylate polymers (Rohm and Haas) and 'Sokalan' acrylate polymers (BASF). Poly(acrylic) homopolymers and co-polymers although not readily biodegradable, can be readily removed from waste water by precipitation and/or adsorption on sewage. Aminocarboxylates polymers or polyaspartates derived from aspartic acid (aminosuccinic acid), on the other hand, can be completely biodegradable depending on the method of synthesis. Polyaspartates that are synthesized by Bayer's process for manufacturing polyaspartic acid involving acid catalyzed polymerization of aspartic acid have been reported as a distinct class of water soluble polymers that are known to be essentially completely biodegradable. Alternate polycarboxylate salts which can also be used according to this invention include salt of poly(dl-lactic acid) and related systems.

Amphoteric surfactants according to this invention are preferably low foam type such as the alkyl imino acid salts based on alkylated carboxy-alkyl tertiary amines of the type R—N($CH_2CH_2COOxy$)$_2$, where R=organic radical represented by $C_nH_{2n+1}$, where n=8–15, x=H, and y=M$^+$, for example, AO-400, bis(2-hydroxyethyl)-isodecyloxypropylamine oxide such as AO-14-2, alkoxypropyl imino acid salt of the type alkali surfactant NM (35% active) available from Tomah Corporation, and related alkali stable materials available from other commercial sources. Medium foam and low foam non-ionic surfactants that can also be used alone or in combination with amphoteric surfactant are: ethoxylated alkyl phenols, primary alcohol ethoxylates, particularly those which are biodegradable, such as Plurafac LF, and polyoxypropylene-polyoxyethylene block co-polymers such as Pluronic 25R8, Pluronic L35 (BASF); Triton DF-12, Triton 54 (Union Carbide); and Polytergent ADL ultra-LF, and SLF-18 B (Olin Corp.), alkyl polyglycosides such as Glucopon LF-1 (Henkel/Emery) and related alkyl polyglycoside and glucosamide based biodegradable surfactants derived from polysaccharide chemistry with EO/PO aliphatic alcohol. In addition, fluoroalkylene-(polyoxyalkylene) surfactants or 'Fluorads' (3M) of low foam type such as FC-171, FC-129, FC-170C, and FC-120 can also be used for the aqueous cleaning compositions according to this invention. Other surface active agents that can be used in conjunction with amphoteric and non-ionic surfactants according to this invention include low foam ionic surfactants such as sodium octyl sulfate, sodium and/or triethanolamine dodecylbenzene sulfonate, and related alkyl aryl sulfonates and sulfates, and carboxylated alcohol and alkyl phenol ethoxylates.

It is preferred that the total concentration of the active ingredients in the cleaning solution comprising polycarboxylate salt, alkali, and surface active agent is in the range 0.3 . 5 weight % and most preferably in the range of 0.5–1.5 weight %. More specifically, the active ingredients in the cleaning solution are present, in weight percent, as 0.1–2.5% polycarboxylate salt, 0.2–2% alkali, and 0.03–0.5% of surface active agent. Preferably, the active ingredients in the cleaning solution are present, in weight percent, as 0.15–0.5% polycarboxylate salt, 0.3–0.5% alkali, and 0.05–0.1% of surface active agent.

Unless otherwise stated herein, all percentages are in weight percent.

The following representative aqueous cleaning compositions according to this invention are formulated by dissolving polyacrylate and/or polyaspartate; Na, K, or tetramethyl ammonium salts (TMA salts); excess alkali to result in a pH of the cleaning composition of about 11.5 to about 13.5; and surface active agent which is preferably a low foam non-ionic, ionic or amphoteric surfactant:

(a) Polyacrylic acid sodium salt (from PAA MW 2000), 0.15–0.5%; NaOH, 0.2–0.5% and an amphoteric surfactant 0.02–0.1%, all in weight percent. The amphoteric surfactant is preferably based on alkylated carboxyalkyl tertiary amine such as AO-400 and/or alkali surfactant NM (Tomah Products). The pH of the solution is preferably in the range 11.5–13.5. Lower pH compositions having pH 8.5–10.5 based on PAA-sodium salt, were not found effective in removing paste residue from metal surfaces. Above pH 13.5, the solutions become too corrosive.

(b) Polyacrylic acid-tetramethyl ammonium salt (PAA-TMAH) formed by neutralization of PAA ('Acusol' 445, MW 4,500) with tetramethyl ammonium hydroxide (TMAH), amphoteric surfactant AO-400 and/or alkali surfactant NM, and additional TMAH to adjust pH to about 12.0–12.6 and having about 0.5–1.5% (wt %) of combined active ingredients, balance being water.

(c) Polycarboxylate salt formed by neutralizing 0.2–1.0% polyacrylic acid-maleic anydride co-polymer (Sokalan 12S) with NaOH, KOH and/or TMAH and additional alkali is added, about 0.3–1.0% to adjust pH in the range of 12.2–12.8. In addition, AO-14-2 amphoteric surfactant in the amount of 0.04–0.06%, a primary alcohol ethoxylate based non-ionic surfactant in the amount of 0.05–0.1%, and sodium or triethanolammonium dodecylbenzene sulfonate ionic surfactant in the amount of 0.02–0.05% were added to the cleaning composition. All amounts are in weight percent.

In operation, a screening mask, associated screening equipment or the like (hereafter screening apparatus) having a paste residue is contacted with the aqueous cleaning composition of the present invention. In this manner, pastes containing, for example, Mo, Cu, W or Cu/Ni as the metal filler in an organic binder system may be effectively removed from metal screening masks such as those made from Mo, Ni/Cu or Cu/Ni/Cu, the latter being electroform masks, and other screening apparatus. The screening apparatus may be pressure spray cleaned with the aqueous alkaline cleaning composition at a pressure of 60–170 psi and at a temperature of 130–165° F. Alternatively, the screening apparatus can be ultrasonically agitated in the aqueous cleaning solution at a temperature of 140–165° F. For screening mask cleaning in an automated screening mask cleaning tool, cycle time for cleaning would be preferably in the range of 15–30 seconds to provide high product throughput.

Various aspects of the present invention are further illustrated by referring to the following examples which are intended only to further illustrate the invention and are not intended to limit the scope of the present invention in any manner.

EXAMPLES

Example 1

To an aqueous solution of polyacrylic acid tetramethyl ammonium salt obtained by neutralizing 152 g of polyacrylic acid (MW about 2000) with 770 ml of a 25% aqueous TMAH in deionized water, was added another 1500 ml of 25% TMAH solution and 100 g (50% active) AO-400 amphoteric surfactant based on alkylated carboxyalkyl tertiary amine, and 60 g (35% active) alkali surfactant NM. The contents were thoroughly mixed and diluted with water to form 5 gallons of the concentrate. For use in mask cleaning, the 5 gallons of concentrate was diluted to 40 gallons to obtain cleaning solution containing 00.23% PAA-TMA salt, 0.27% TMAH, and 0.032% AO-400 surfactant (or about 320 ppm) and about 120 ppm of alkali surfactant NM in a tank with a circulation pump and heated to about 165–175° F. Metal masks carrying residue of a conductive paste comprising dispersion of Mo powder in ethyl cellulose polymer binder with Texanol as solvent vehicle along with surfactant or dispersant and a thickening agent, cleaned with the solution by pressurized spray through a multi-nozzle spray head at about 150 psi with up and down strokes for 15–20 sec. The cleaning cycle was immediately followed by rinse with hot deionized water under the same temperature but at a lower pressure, about 60–80 psi spray conditions, followed by hot air drying. Microscopic examination of the cleaned masks showed no evidence of any residue on the surface or in the features.

Cleaning solution comprising PAA-TMA salt/TMAH/AO-400 and alkali surfactant NM of the same composition as given above with the addition of about 0.03% of ethoxylated long chain alcohol as a non-ionic surfactant, was used for cleaning residue of pastes based on Cu, W, and Cu/Ni as the metal filler in ethyl cellulose/Texanol as binder/solvent vehicle system. Pressurized spray of heated solution as described above for Mo pastes provided effective cleaning of all paste types showing no evidence of any residue on the surface or in the mask features on microscopic inspection.

Example 2

A cleaning solution concentrate was prepared by blending 202 g of polyacrylic acid sodium salt, prepared by neutralizing 130 g polyacrylic acid (MW about 2000) with 10% NaOH in water (720 ml), 2 liter of 25% (wt %) aqueous TMAH and 200 g (50% active) AO-400. The mixture was diluted to one gallon by adding deionized water to obtain cleaning solution concentrate. Prior to use for mask cleaning, the concentrate was poured into deionized water in a tank to make up to 40 gallons of cleaning solution comprising 0.18% PAA-sodium salt, 0.33% TMAH, and 0.0.064% AO-400 (amphoteric surfactant) as the active ingredients.

Pressurized spray cleaning of Mo, Cu, and W based paste residue from screening masks with heated solution at 150–160° F. and about 150–170 psi according to the process described in Example 1 (above) provided effective cleaning of all types of pastes from Mo and Ni—Cu electroform metal masks with the cleaning cycle time of 15–25 sec.

The above solution was also used for paste residue removal from metal masks using a standard single nozzle one-side pressure spray at 50–70 psi and 130–150° F. solution temperature. Under these conditions, it required 30–60 sec cleaning cycle time, deionized water rinse for 30–45 sec followed by hot air dry. Inspection of the masks after cleaning showed that all paste residue was cleaned from the mask surface and the mask features regardless of the paste type.

Example 3

An aqueous alkaline composition containing polyacrylic acid-maleic anhydride (PAA-MA) copolymer sodium salt prepared by neutralizing 463 g of Sokalan 12S (50% active), with 148 g NaOH in deionized water, 190 g excess NaOH, 1 liter 25% aqueous TMAH, 160 g of 50% active amphoteric surfactant AO-400 and 40 g of a non-ionic surfactant Pluronic 25R8 was diluted with deionized water to make up 5 gallons of the concentrate. Prior to use for mask cleaning, the concentrate was diluted to 40 gallons to obtain the cleaning solution comprising 0.25% PAA-MA sodium salt, 0.12% NaOH, 0.16% TMAH, and 0.07% surfactant as the active ingredients. The solution was heated to about 150–160° F. and used for mask cleaning by high pressure spray at 140–150 psi with a multi-nozzle spray head or by ultrasonic agitation as described above. After the cleaning cycle that removed all paste residue, the masks were immediately rinsed with water and dried by blowing hot air. Various paste types comprising Mo, Cu, W, or Ni filler in ethyl cellulose-texanol as binder/solvent system cleaned very well from metal masks showing no evidence of residue on the surface or the mask features.

Example 4

A cleaning solution containing 0.35% PAA-MA copolymer potassium salt, 0.43% KOH, and 400 ppm of a combination of an amphoteric surfactant and poly(oxyethyleneoxypropylene)octyl phenyl ether as a non-ionic surfactant was formed by mixing 150 g of PAA-MA (Sokalan 12S, 50% active ingredient) in a 10% KOH solution, 1.5 liter, with 12.5 g AO-400 (50% active), and 1.5 g Triton x405, and diluted with deionized water to 5 gallons. The solution was heated to 150–160° F. in an ultrasonic bath and its effectiveness was tested with paste processing parts carrying heavy paste residue. Ultrasonic agitation in the bath operated at 40 kHz for 1–2 min followed by water rinse using hot water pressurized spray or with ultrasonic agitation, and drying showed complete removal of all types of paste residues.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An aqueous alkaline cleaning composition for removing paste residue from screening apparatus in the fabrication of ceramic substrates comprising a water soluble polycarboxylate salt in excess alkali, wherein the polycarboxylate salt is derived from the reaction of an alkali with a component selected from the group consisting of polyacrylic acid, polymethacrylic acid, poly (acrylic acid-co-methacrylic acid), polyacrylic-maleic acid copolymer, acrylic acid-maleic anhydride co-polymer, poly (maleic acid), poly (maleic acid-co-olefin), polyaspartic acid, poly (dl-lactic acid), and combinations thereof, and wherein the alkali is an organic quaternary ammonium hydroxide.

2. The aqueous cleaning composition of claim 1 wherein the organic quaternary ammonium hydroxide is tetramethyl ammonium hydroxide.

3. The aqueous cleaning composition of claim 1 wherein the organic quaternary ammonium hydroxide is trimethyl-2-hydroxyethyl ammonium hydroxide.

4. The aqueous cleaning composition of claim 1 further comprising a surface active agent selected from the group consisting of medium foam surface active agents, low foam surface active agents, no foam surface active agents, and combinations thereof.

5. The aqueous cleaning composition of claim 4, wherein the surface active agent is an aqueous alkali compatible low foam amphoteric surfactant based on alkylated carboxyalkyl tertiary amines represented by the formula R—N(CH$_2$CH$_2$COOxy)$_2$, where x=H, and y=Na$^+$, K$^+$, or (CH3)$_4$N$^+$ (tetramethyl ammonium) radical, and R=organic radical represented by C$_n$H$_{2n+1}$ where n=8–15, alkoxypropyl carboxyalkyl tertiary amine based based surfactant represented by the formula R—O—(CH$_2$)$_3$—N(CH$_2$CH$_2$CQOxy)$_2$ where x=H, and y=Na$^+$, K$^+$, or (CH$_3$)$_4$N$^+$ radical, and R=organic radical represented by the formula C$_n$H$_{2n+1}$ where n=8–15; and combination thereof.

6. The aqueous cleaning composition of claim 4, wherein the surface active agent is selected from the group consisting of non-ionic surfactants, amphoteric surfactants, ionic surfactants, and combinations thereof.

7. The aqueous cleaning composition of claim 6, wherein the non-ionic surfactant is selected from the group consisting of ethoxylated-propoxylated alkyl phenols; biodegradable surfactants based on primary alcohol ethoxylates, polyalkylglycosides based on polysaccharide chemistry, and polyoxypropylene-polyoxyethylene block co-polymers, and combinations thereof.

8. The aqueous cleaning composition of claim 4, wherein the total concentration of the active ingredients in the cleaning solution comprising polycarboxylate salt, alkali, and surface active agent is in the range 0.3–5 weight %.

9. The aqueous cleaning composition of claim 8 wherein the total concentration of the active ingredients is in the range of 0.5–1.5 weight %.

10. The aqueous cleaning composition of claim 1 having a pH in the range 11.5–13.5.

11. The aqueous cleaing composition of claim 10 wherein the pH is in the range 11.9–12.6.

12. The aqueous cleaning composition of claim 4, wherein the active ingredients in the cleaning solution are present, in weight percent, as 0.1–2.5% polycarboxylate salt, 0.2–2% alkali, and 0.03–0.5% of surface active agent.

13. The aqueous cleaning composition of claim 4, wherein the active ingredients in the cleaning solution are present, in weight percent, as 0.1–0.5% polycarboxylate salt, 0.3–0.5% alkali, and 0.03–0.05% of surface active agent.

14. The aqueous cleaning composition of claim 1 wherein the polycarboxylate salt is selected from the group consisting of sodium polyacrylate, potassium polyacrylate, tetramethyl ammonium-polyacrylate, poly(acrylate-maleate), polyaspartate, polylactate, and combinations thereof.

15. A method of cleaning paste residue from screening apparatus comprising the step of contacting the screening mask having a paste residue with an aqueous alkaline cleaning composition comprising a water soluble polycarboxylate salt in excess alkali.

16. The method of claim 15 wherein the polycarboxylate salt is derived from the reaction of an alkali with a component selected from the group consisting of polyacrylic acid, polymethacrylic acid, poly(acrylic acid-co-methacrylic acid), poly(acrylic acid-co--maleic anhydride), poly (acrylic acid-co-maleic acid, poly(maleic acid), poly(maleic acid-co-olefin), polyaspartic acid, poly(dl-lactic acid), and combinations thereof.

17. The method of claim 16 wherein the alkali is selected from the group consisting of sodium hydroxide, potassium hydroxide, organic quaternary ammonium hydroxide, alkali metal carbonate, bicarbonate, sesquicarbonate, and combinations thereof.

18. The method of claim 17 wherein the organic quaternary ammonium hydroxide is tetramethyl ammonium hydroxide.

19. The method of claim 17 wherein the organic quaternary ammonium hydroxide is trimethyl 2-hydroxyethyl ammonium hydroxide.

20. The method of claim 15 wherein the aqueous cleaning composition further comprising a low foam surface active agent.

21. The method of claim 20 wherein the surface active agent is an aqueous alkali compatible low foam amphoteric surfactant based on alkylated carboxy-alkyl tertiary amines represented by the formula R—N($CH_2CH_2COOxy)_2$ where x=H. and y=$Na^+$, $K^+$, or $(CH3)N^+$ (tetramethyl ammonium) radical, and R=organic radical represented by $C_nH_{2n+1}$ where n=8–12; alkoxypropyl carboxyalkyl tertiary amine based surfactant represented by the formula R—O—$(CH_2)_3$—N($CH_2CH_2COOxy)_2$ where x=H, and y=$Na^+$, $K^+$, or $(CH_3)_4N^+$ radical, and R=organic radical represented by the formula $C_nH_{2n+1}$ where n=8–15; and combinations thereof.

22. The method of claim 20, wherein the surface active agent is selected from the group consisting of non-ionic surfactants, amphoteric surfactants, ionic surfactants, and combinations thereof.

23. The method of claim 22 wherein the non-ionic surfactant is selected from the group consisting of ethoxylates-propoxylated alkyl phenols, biodegradable surfactants based on primary alcohol ethoxylates, polyalkylglycosides based on polysaccharide chemistry, and polyoxypropylene-polyoxyethylene block co-polymers, and combinations thereof.

24. The method of claim 20 wherein the total concentration of the active ingredients in the cleaning solution comprising polycarboxylate salt, alkali, and surface active agent is in the range 0.3–5 weight %.

25. The method of claim 24 wherein the total concentration of the active ingredients is in the range of 0.5–1.5 weight %.

26. The method of claim 15 wherein the aqueous cleaning composition having a pH in the range 11.5–13.5.

27. The method of claim 26 wherein the pH is in the range 11.9–12.6.

28. The method of claim 20, wherein the active ingredients in the cleaning solution are present, in weight percent, as 0.1–2.5% polycarboxylate salt, 0.3–2% alkali, and 0.02–0.5% of surface active agent.

29. The method of claim 20, wherein the active ingredients in the cleaning solution are present, in weight percent, as 0.1–0.5% polycarboxylate salt, 0.3–0.5% alkali, and 0.03–0.1% of surface active agent.

30. The method of claim 15 wherein the polycarboxylate salt is selected from the group consisting of sodium polyacrylate, potassium polyacrylate, tetramethyl ammonium-polyacrylate, sodium, potassium, tetramethylammonium salt of acrylic acid-maleic anhydride co-polymer, poly(acrylate-maleate), polyaspartate, polylactate, and combinations thereof.

31. The method of claim 15 wherein the step of contacting includes pressurized spraying the aqueous cleaning solution at a pressure of 60–170 psi and at a temperature of 130–165° F. for less than 1 min, and further comprising the step of water rinsing the aqueous cleaning solution from the mask after contacting with the aqueous cleaning solution.

32. The method of claim 15 wherein the step of contacting comprises ultrasonically agitating the screening mask in the aqueous cleaning solution at a temperature of 140–165° F.

* * * * *